US011532709B2

(12) United States Patent
Lee et al.

(10) Patent No.: US 11,532,709 B2
(45) Date of Patent: Dec. 20, 2022

(54) FIELD EFFECT TRANSISTOR INCLUDING CHANNEL FORMED OF 2D MATERIAL

(71) Applicant: Samsung Electronics Co., Ltd., Suwon-si (KR)

(72) Inventors: Minhyun Lee, Suwon-si (KR); Minsu Seol, Seoul (KR); Yeonchoo Cho, Seongnam-si (KR); Hyeonjin Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/203,010

(22) Filed: Mar. 16, 2021

(65) Prior Publication Data

US 2021/0296445 A1 Sep. 23, 2021

(30) Foreign Application Priority Data

Mar. 18, 2020 (KR) .......................... 10-2020-0033310

(51) Int. Cl.
*H01L 29/10* (2006.01)
*H01L 29/24* (2006.01)
*H01L 29/423* (2006.01)

(52) U.S. Cl.
CPC .......... *H01L 29/1033* (2013.01); *H01L 29/24* (2013.01); *H01L 29/42356* (2013.01); *H01L 29/42364* (2013.01)

(58) Field of Classification Search
CPC ............... H01L 29/0673; H01L 29/778; H01L 29/1033; H01L 29/41725; H01L 29/41733
See application file for complete search history.

(56) References Cited

U.S. PATENT DOCUMENTS

| 7,427,788 | B2 | 9/2008 | Li et al. |
| 7,648,883 | B2 | 1/2010 | Park |
| 8,932,919 | B2 | 1/2015 | Farmer et al. |
| 9,608,101 | B2 | 3/2017 | Kis et al. |
| 9,711,613 | B2 | 7/2017 | Franklin et al. |
| 10,269,981 | B2 | 4/2019 | Chen et al. |

(Continued)

FOREIGN PATENT DOCUMENTS

| CN | 106601815 A | 4/2017 |
| KR | 2005-0112430 A | 11/2005 |
| KR | 2006-0037561 A | 5/2006 |

OTHER PUBLICATIONS

'The International Roadmap for Devices and Systems—2017 Edition' IEEE, 2017.

(Continued)

*Primary Examiner* — Changhyun Yi
(74) *Attorney, Agent, or Firm* — Harness, Dickey & Pierce, P.L.C.

(57) ABSTRACT

A field effect transistor includes a substrate, a source electrode and a drain electrode on the substrate and apart from each other in a first direction, a plurality of channel layers, a gate insulating film surrounding each of the plurality of channel layers, and a gate electrode surrounding the gate insulating film. Each of the plurality of channel layers has ends contacting the source electrode and the drain electrode. The plurality of channel layers are spaced apart from each other in a second direction away from the substrate. The plurality of channel layers include a 2D semiconductor material.

17 Claims, 13 Drawing Sheets

(56) References Cited

U.S. PATENT DOCUMENTS

| | | |
|---|---|---|
| 10,388,732 B1 | 8/2019 | Frougier et al. |
| 2006/0091481 A1 | 5/2006 | Li et al. |
| 2007/0111532 A1 | 5/2007 | Lee et al. |
| 2011/0315950 A1* | 12/2011 | Sleight .................. B82Y 10/00 257/E29.245 |
| 2014/0197459 A1* | 7/2014 | Kis .................. H01L 29/40111 257/194 |
| 2015/0370948 A1 | 12/2015 | Kawa et al. |
| 2017/0162654 A1 | 6/2017 | Maeda et al. |
| 2017/0194429 A1 | 7/2017 | Guillorn et al. |
| 2017/0256609 A1* | 9/2017 | Bhuwalka ......... H01L 29/42376 |
| 2019/0148489 A1 | 5/2019 | Bhuwalka et al. |

OTHER PUBLICATIONS

Francisco Gámiz et al., 'Monte-Carlo simulation of ultra-thin film silicon-on-insulator MOSFETs' *International Journal of High Speed Electronics and Systems*, vol. 22., No. 1, Dec. 2013, pp. 1350001-1-1350001-32.

Seonghoon Jin et al., 'Modeling of Surface-Roughness Scattering in Ultrathin-Body SOI MOSFETs' *IEEE Transactions on Electronic Devices*, vol. 54, No. 9, Sep. 2007, pp. 2191-2203.

Te-Kuang Chiang, 'A Short-Channel-Effect-Degraded Noise Margin Model for Junctionless Double-Gate MOSFET Working on Subthreshold CMOS Logic Gates' *IEEE Transactions on Electron Devices*, vol. 63, No. 8, Aug. 2016, pp. 3354-3359.

Yuan Liu et al., 'Van der Waals heterostructures and devices' *Nature Reviews—Materials*, vol. 1, No. 9, Sep. 2016.

Extended European Search Report dated Jul. 28, 2021, issued in corresponding European Patent Application No. 21162833.4.

\* cited by examiner

FIELD EFFECT TRANSISTOR INCLUDING CHANNEL FORMED OF 2D MATERIAL

CROSS-REFERENCE TO RELATED APPLICATION

This application claims the benefit of Korean Patent Application No. 10-2020-0033310, filed on Mar. 18, 2020, in the Korean Intellectual Property Office, the disclosure of which is incorporated herein in its entirety by reference.

BACKGROUND

1. Field

The disclosure relates to a field effect transistor including a channel formed of a two-dimensional (2D) material.

2. Description of Related Art

Transistors are semiconductor devices that perform electrical switching and are adopted in various integrated circuit devices including a memory, a driving IC, and a logic device. To increase the integration of an integrated circuit device, a space occupied by a transistor provided in the integrated circuit device is drastically reduced. Accordingly, a study to reduce the size of a transistor while maintaining performance has been conducted.

When a channel length decreases as the size of a transistor decreases, a short channel effect may result. For example, issues may include a threshold voltage variation, carrier velocity saturation, and deterioration of the sub-threshold characteristics. Accordingly, a way to limit the short channel effect and effectively reduce the channel length has been sought.

SUMMARY

Provided is a field effect transistor including a channel formed of a two-dimensional (2D) material.

Additional aspects will be set forth in part in the description which follows and, in part, will be apparent from the description, or may be learned by practice of the presented embodiments of the disclosure.

According to example embodiments, a field effect transistor includes a substrate, a source electrode and a drain electrode on the substrate and apart from each other in a first direction, a plurality of channel layers, a gate insulating film surrounding each of the plurality of channel layers, and a gate electrode surrounding the gate insulating film. Each of the plurality of channel layers has ends contacting the source electrode and the drain electrode. The plurality of channel layers are spaced apart from each other in a second direction away from the substrate. The plurality of channel layers include a 2D semiconductor material.

In some embodiments, each of the plurality of channel layers may include two edges extending in a third direction perpendicular to the first direction and the second direction. The two edges respectively may contact the source electrode and the drain electrode.

In some embodiments, each of the plurality of channel layers may include two contact areas in planar contact with the source electrode and the drain electrode.

In some embodiments, the plurality of channel layers may include a first channel layer and a second channel layer having different lengths in the first direction.

In some embodiments, the first channel layer and the second channel layer may be arranged on the substrate in order of length in the first direction decreasing.

In some embodiments, the first channel layer and the second channel layer may have different thicknesses from each other.

In some embodiments, the first channel layer and the second channel layer may have different lengths in a third direction perpendicular to each of the first direction and the second direction.

In some embodiments, the first channel layer and the second channel layer may be arranged on the substrate in order of length in the third direction decreasing.

In some embodiments, the gate insulating film may contact the plurality of channel layers and have a shape surrounding each of the plurality of channel layers in a closed path with an axis in the first direction.

In some embodiments, the gate electrode may be apart from the plurality of channel layers and have a shape surrounding each of the plurality of channel layers in a closed path with an axis in the first direction.

In some embodiments, the gate insulating film may have a shape of extending to an area between the gate electrode and the source electrode and an area between the gate electrode and the drain electrode.

In some embodiments, the 2D semiconductor material may include graphene, black phosphorus, phosphorene, or a transition metal dichalcogenide.

In some embodiments, the transition metal dichalcogenide may a metal element and a chalcogen element. The metal element may include Mo, W, Nb, V, Ta, Ti, Zr, Hf, Tc, Re, Cu, Ga, In, Sn, Ge, Pb, or a combination thereof. The chalcogen element may include S, Se, Te, or a combination thereof.

In some embodiments, the 2D semiconductor material may be doped with a conductive dopant.

In some embodiments, the plurality of channel layers may include a same 2D semiconductor material.

In some embodiments, the gate insulating film may include a high-k dielectric material or a ferroelectric material.

In some embodiments, A length of the channel layer in the first direction may be set to a minimum length determined by a thickness of the channel layer in the second direction In some embodiments, a thickness of at least one of the plurality of channel layers in the second direction is greater than 0 nm and less than or equal to about 5 nm.

In some embodiments, a thickness in the second direction of at least one of the plurality of channel layers is greater than 0 nm and less than equal to about 1 nm.

In some embodiments, a length in the first direction of at least one of the plurality channel layers is greater than 0 nm and less than or equal to about 3 nm.

According to example embodiments, a field effect transistor incudes a source electrode and a drain electrode spaced apart from each other in a first direction; a plurality of channel layers between the source electrode and the drain electrode, a gate insulating film surrounding each of the plurality of channel layers; and a gate electrode surrounding the gate insulating film. The plurality of channel layers may be spaced apart from each other in a second direction. The second direction crosses the first direction. The plurality of channel layers may include a 2D semiconductor material. The plurality of channel layers may each have a first end contacting the source electrode and a second end contacting the drain electrode.

In some embodiments, the plurality of channel layers may include a first channel layer and a second channel layer having different lengths in the first direction.

In some embodiments, the first channel layer and the second channel layer may have different thicknesses from each other.

In some embodiments, the 2D semiconductor material may include graphene, black phosphorus, phosphorene, or a transition metal dichalcogenide.

In some embodiments, the thickness of at least one of the plurality of channel layers in the second direction may be greater than 0 nm and less than or equal to about 5 nm.

BRIEF DESCRIPTION OF THE DRAWINGS

The above and other aspects, features, and effects of certain embodiments of the disclosure will be more apparent from the following description taken in conjunction with the accompanying drawings, in which.

DETAILED DESCRIPTION

Figure 1:
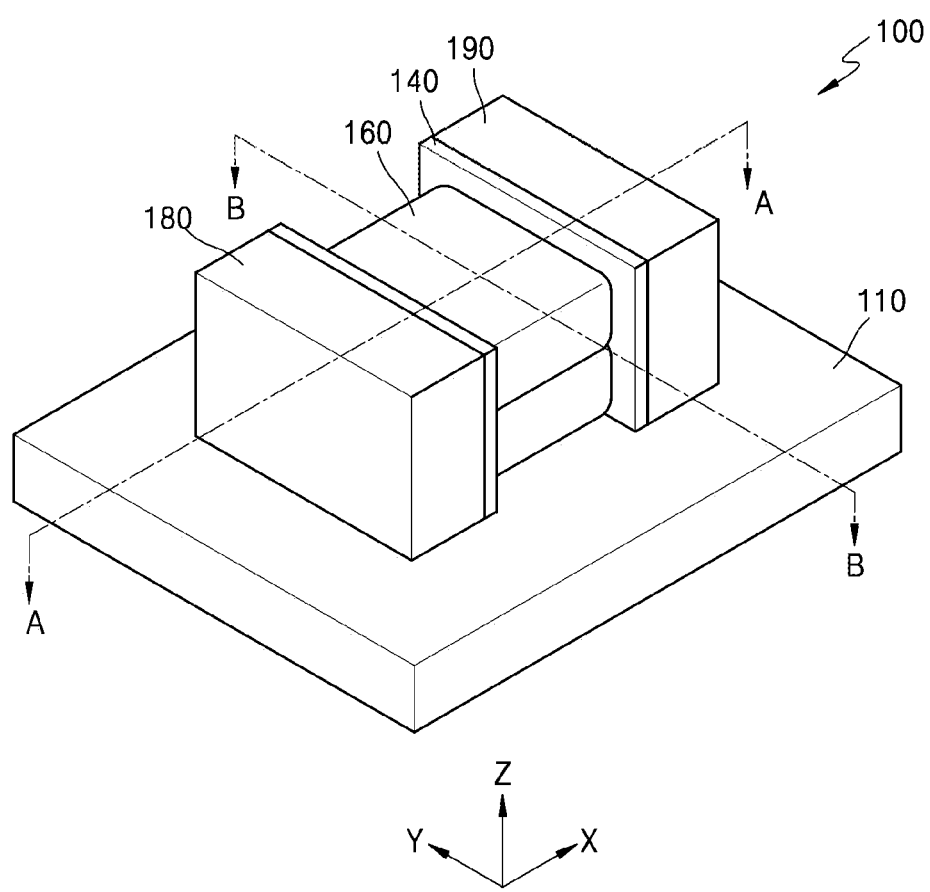
FIG. 1 is a perspective view of a schematic structure of a field effect transistor according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings. In this regard, the present embodiments may have different forms and should not be construed as being limited to the descriptions set forth herein. Throughout the drawings, like reference numerals refer to like elements. The thickness or size of each layer illustrated in the drawings may be exaggerated for convenience of explanation and clarity.

In a layer structure, when a constituent element is disposed "above" or "on" to another constituent element, the constituent element may be only directly on the other constituent element or above the other constituent elements in a non-contact manner.

Terms such as "first" and "second" are used herein merely to describe a variety of constituent elements, but the constituent elements are not limited by the terms. Such terms are used only for the purpose of distinguishing one constituent element from another constituent element. The terms do not limit that the material or structure of the constituent elements are different from one another.

An expression used in the singular encompasses the expression of the plural, unless it has a clearly different meaning in the context. It will be further understood that the terms "comprises" and/or "comprising" used herein specify the presence of stated features or components, but do not preclude the presence or addition of one or more other features or components.

Furthermore, terms such as "~portion", "~unit", "~module", and "~block" stated in the specification may signify a unit to process at least one function or operation and the unit may be embodied by hardware, software, or a combination of hardware and software.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The use of the terms "a" and "an" and "the" and similar referents in the context of describing the disclosure are to be construed to cover both the singular and the plural.

Also, the steps of all methods described herein can be performed in any suitable order unless otherwise indicated herein or otherwise clearly contradicted by context. The disclosure is not limited to the described order of the steps. Furthermore, the use of any and all examples, or language (e.g., "such as") provided herein, is intended merely to better illuminate the disclosure and does not pose a limitation on the scope of the disclosure unless otherwise claimed.

Figure 2:
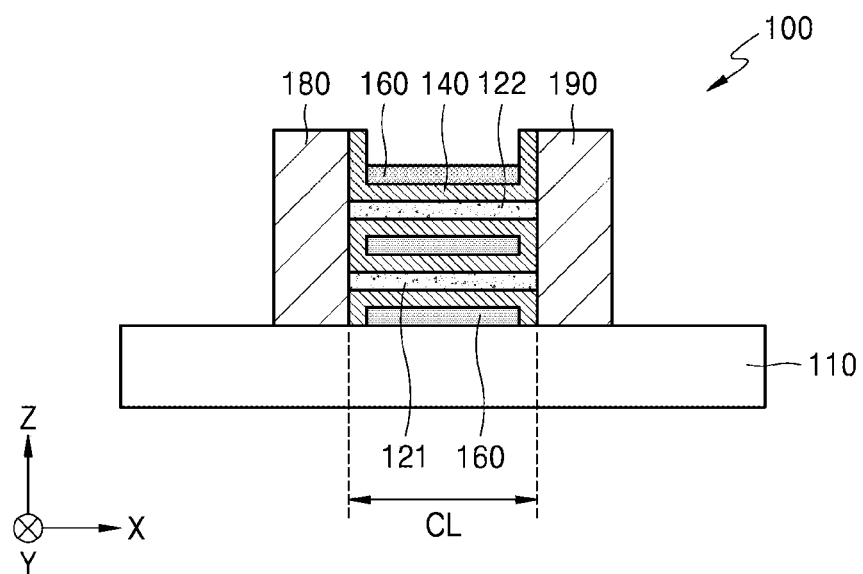
FIG. 2 is a cross-sectional view taken along line A-A of the field effect transistor of FIG. 1.
Figure 3:
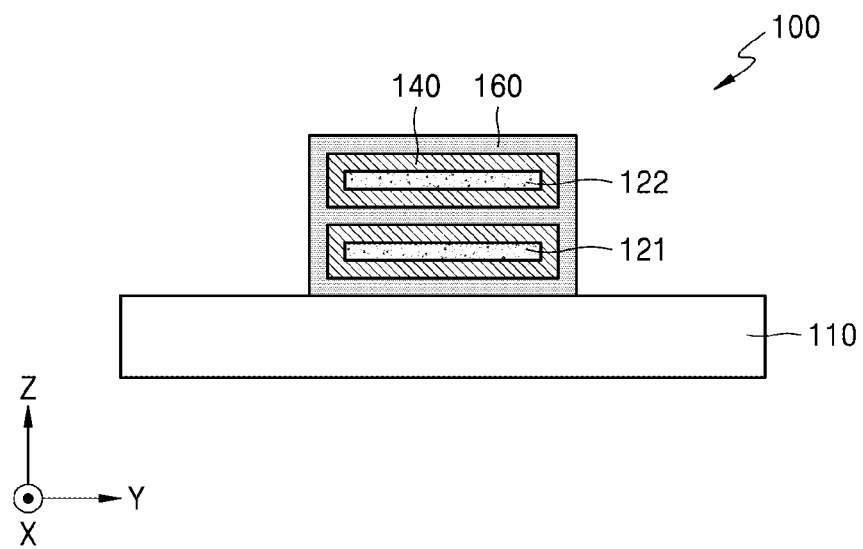
FIG. 3 is a cross-sectional view taken along line B-B of the field effect transistor of FIG. 1.

FIG. 1 is a perspective view of a schematic structure of a field effect transistor 100 according to an embodiment. FIG. 2 is a cross-sectional view taken along line A-A of the field effect transistor 100 of FIG. 1. FIG. 3 is a cross-sectional view taken along line B-B of the field effect transistor 100 of FIG. 1.

Referring to FIGS. 1 to 3, the field effect transistor 100 may include a plurality of channel layers including a first channel layer 121 and a second channel layer 122 disposed on a substrate 110, a source electrode 180 and a drain electrode 190 contacting the channel layers 121 and 122, and a gate electrode 160 disposed apart from the channel layers 121 and 122.

The substrate 110 may be an insulating substrate or a semiconductor substrate having an insulating layer formed on a surface thereof. The semiconductor substrate may include, for example, Si, Ge, SiGe or a Group III-V semiconductor material. The substrate 110 may be, for example, a silicon substrate having a silicon oxide formed on a surface thereof, but the disclosure is not limited thereto.

The source electrode 180 and the drain electrode 190 may be disposed apart from each other in a first direction on the substrate 110, and the first channel layer 121 and the second channel layer 122 may be disposed apart from each other in a second direction between the source electrode 180 and the drain electrode 190. The first direction may be an X direction, and the second direction may be a Z direction.

A gate insulating film 140 may be provided to surround each of the first channel layer 121 and the second channel layer 122. The gate electrode 160 may be provided to surround the gate insulating film 140.

As illustrated in FIG. 3, the gate insulating film 140 may contact the first channel layer 121 and the second channel layer 122 and may have a shape surrounding each of the first channel layer 121 and the second channel layer 122 in a closed path with an axis in the first direction (X direction). The gate electrode 160 may be apart from the first channel layer 121 and the second channel layer 122 with the gate insulating film 140 therebetween and may have a shape surrounding each of the first channel layer 121 and the second channel layer 122 in a closed path with an axis in the first direction (X direction).

The gate insulating film 140 may insulate as above between the first channel layer 121 and the gate electrode 160 and between the second channel layer 122 and the gate electrode 160, thereby restricting a leakage current. The gate insulating film 140 may also extend toward an area between the gate electrode 160 and the source electrode 180 and an area between the gate electrode 160 and the drain electrode 190 and may insulate between the gate electrode 160 and the source electrode 180 and between the gate electrode 160 and the drain electrode 190.

A contact between each of the first channel layer 121 and the second channel layer 122, and the source electrode 180 and the drain electrode 190, may have an edge contact form. An edge contact form may denote a state in which a side surface (or edge portion) of the graphene contacts a surface of the source electrode 180 and/or drain electrode 190. In an edge contact form, the side surface (or edge) of the graphene may directly contact the surface of the source electrode 180 and/or drain electrode 190.

As illustrated in FIG. 2, both ends of the first channel layer 121 are provided with an edge extending in a third direction (Y direction), and the two edges may respectively contact the source electrode 180 and the drain electrode 190. The second channel layer 122 contacts the source electrode 180 and the drain electrode 190 in the same manner.

The field effect transistor 100 according to an embodiment may have a multi-bridge shape as the both ends of each of the first channel layer 121 and the second channel layer 122 contact the source electrode 180 and the drain electrode 190 and the first channel layer 121 and the second channel layer 122 are stacked apart from each other in a direction away from the substrate 110. The multi-bridge shaped channel may reduce a short channel effect and also an area occupied by a source/drain, which may be advantageous for high integration. Furthermore, as a source/drain junction capacitance may be maintained constant regardless of the location of a channel, a high speed and high reliable device may be obtained. Although the multi-bridge channel is illustrated as having two channel layers, this is merely an example, and the disclosure is not limited thereto. The field effect transistor 100 according to an embodiment may include a plurality of channel layers where more than three thereof are stacked.

The field effect transistor 100 according to an embodiment may employ a two-dimensional (2D) semiconductor material as a material of the first channel layer 121 and the second channel layer 122. The 2D semiconductor material may mean a semiconductor material having a 2D crystal structure and may have a monolayer or a multilayer structure. Each layer constituting the 2D semiconductor material may have a thickness of an atomic level. The thickness of each of the first channel layer 121 and the second channel layer 122 may be about 10 nm or less. However, the disclosure is not limited thereto, and to implement a short channel length CL, the thickness of each of the first and second channel layers 121 and 122 may be further decreased.

The field effect transistor 100 according to an embodiment may include a relatively shorter channel length CL because a 2D semiconductor material is used for the first channel layer 121 and the second channel layer 122. The channel length CL may mean the length of each of the channel layers 121 and 122 between the source electrode 180 and the drain electrode 190, that is, the length in the first direction (X direction) as illustrated in FIG. 2. The channel length CL is related to the thickness of each of the channel layers 121 and 122, and the channel length CL may be set to be the minimum length determined by the thickness of each of the channel layers 121 and 122. The thickness may mean a thickness in a stacking direction, that is, the second direction (Z direction).

The thickness of each of the first channel layer 121 and the second channel layer 122 may be 5 nm or less and greater than 0 nm. The thickness of each of the first channel layer 121 and the second channel layer 122 may be 1 nm or less. The channel length CL of each of the first channel layer 121 and the second channel layer 122 may be 3 nm or less.

The 2D semiconductor material has excellent electrical properties and keeps high mobility, without much change in the properties, even when the thickness decreases to a nano scale, and thus, may be applied to various devices.

The 2D semiconductor material may include, for example, at least one of graphene, black phosphorus, or transition metal dichalcogenide (TMD). The graphene is a material having a hexagonal honeycomb structure as carbon atoms are bonded two dimensionally and has advantages of having a high electric mobility and excellent thermal properties, compared to silicon (Si), being chemically stable, and having a large surface area. The black phosphorus is a material in which black phosphorous atoms are bonded two dimensionally.

The TMD may include, for example, one transition metal element of Mo, W, Nb, V, Ta, Ti, Zr, Hf, Tc, and Re and one chalcogen element of S, Se, and Te. The TMD may be expressed by, for example, $MX_2$, where M denotes transition metal and X denotes a chalcogen element. For example, M may include Mo, W, Nb, V, Ta, Ti, Zr, Hf, Tc, Re, etc., and X may include S, Se, Te, etc. Accordingly, for example, the TMD may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, etc. Alternatively, the TMD may not be expressed by $MX_2$. In this case, for example, the TMD may include CuS that is a compound of transition metal of Cu and a chalcogen element of S. The TMD may be a chalcogenide material including non-transition metal. The non-transition metal may include, for example, Ga, In, Sn, Ge, Pb, etc. In this case, the TMD may include a compound of non-transition metal of Ga, In, Sn, Ge, Pb, etc. and a chalcogen element of S, Se, Te, etc. For example, the TMD may include $SnSe_2$, GaS, GaSe, GaTe, GeSe, $In_2Se_3$, $InSnS_2$, etc.

As described above, the TMD may include one metal element of Mo, W, Nb, V, Ta, Ti, Zr, Hf, Tc, Re, Cu, Ga, In, Sn, Ge, and Pb and one chalcogen element of S, Se, and Te. However, the above-mentioned materials are merely example, and other different materials may be used as a TMD material.

The 2D semiconductor material may be doped with a p-type dopant or an n-type dopant to adjust mobility. For example, a p-type dopant and an n-type dopant that are used for graphene, carbon nanotube (CNT), etc. may be used as the p-type dopant and the n-type dopant. The p-type dopant or the n-type dopant may be doped using an ion implantation method or a chemical doping method.

The first channel layer 121 and the second channel layer 122 may include the same 2D semiconductor material and have the same thickness. However, the disclosure is not limited thereto, and the first channel layer 121 and the second channel layer 122 may include different types of 2D semiconductor materials or may include different thicknesses from each other.

Each of the source electrode 180 and the drain electrode 190 may include a metal material having excellent electrical conductivity. For example, each of the source electrode 180 and the drain electrode 190 may include metal such as magnesium (Mg), aluminum (Al), scandium (Sc), titanium (Ti), vanadium (V), chromium (Cr), manganese (Mn), nickel (Ni), copper (Cu), zinc (Zn), gallium (Ga), zirconium (Zr), niobium (Nb), molybdenum (Mo), lead (Pd), silver (Ag), cadmium (Cd), indium (In), tin (Sn), lanthanum (La), hafnium (Hf), tantalum (Ta), tungsten (W), iridium (Ir), platinum (Pt), gold (Au), bismuth (Bi), etc., or an alloy thereof.

The gate electrode 160 may include a metal material or a conductive oxide. The metal material may include, for example, at least one selected from the group consisting of Au, Ti, TiN, TaN, W, Mo, WN, Pt, and Ni. The conductive oxide may include, for example, indium tin oxide (ITO), indium zinc oxide (IZO), etc. The gate electrode 160 may include the same material as the source electrode 180 and the drain electrode 190.

The gate insulating film 140 may include a high-k dielectric material that is a material having a high dielectric constant (e.g., a higher dielectric constant than a dielectric constant of silicon dioxide). The gate insulating film 140 may include, for example, an aluminum oxide, a hafnium oxide, a zirconium hafnium oxide, a lanthanum oxide, etc. However, the disclosure is not limited thereto.

The gate insulating film 140 may include a ferroelectric material. The ferroelectric material has spontaneous electric dipoles as a charge distribution in a unit cell in a crystallized material structure is non-centrosymmetric, that is, spontaneous polarization. Accordingly, the ferroelectric material has remnant polarization by the dipoles when there is no external electric field. Furthermore, the direction of polarization by the external electric field may be switched in units of domains. The ferroelectric material may include, for example, at least one oxide selected from among Hf, Si, Al, Zr, Y, La, Gd, and Sr, but this is merely an example. Furthermore, as necessary, the ferroelectric material may further include a dopant.

When the gate insulating film 140 includes a ferroelectric material, the field effect transistor 100 may be applied to, for example, a logic device, a memory device, etc. When the gate insulating film 140 includes a ferroelectric material, sub-threshold swing (SS) may be reduced by a negative capacitance effect, and thus while the size of the field effect transistor 100 is reduced, the performance thereof may be improved.

The gate insulating film 140 may have a multilayer structure having a high-k material and a ferroelectric material. As the gate insulating film 140 includes a charge trapping layer such as silicon nitride, etc., the field effect transistor 100 may operate as a memory transistor having memory characteristics.

The field effect transistor 100 according to an embodiment may reduce a short channel effect by employing a 2D semiconductor material as a channel material, thereby implementing a short channel length.

The short channel effect may mean a performance limit occurring when the channel length decreases, that is, a phenomenon, for example, threshold voltage variation, carrier velocity saturation, or deterioration of the sub-threshold characteristics.

Figure 4:
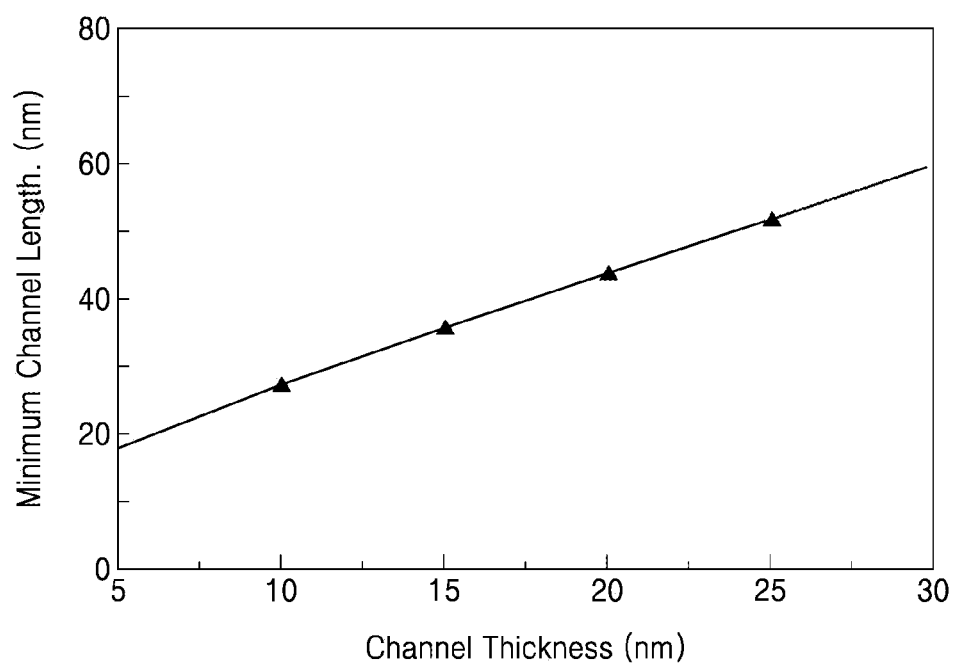
FIG. 4 is a graph showing a concept of a minimum channel length varying depending on a channel thickness due to a short channel effect.

The short channel effect may be related to the channel thickness. FIG. 4 is a graph showing a concept of a minimum channel length varying depending on a channel thickness due to a short channel effect. As shown in the graph, as the channel thickness decreases, a minimum channel length that may be implemented decreases. Accordingly, in order to implement an ultra-compact transistor to increase a degree of integration, by decreasing channel thickness, the channel length may be effectively reduced.

When the channel thickness is reduced by using a typical bulk material, for example, a silicon-based material, the channel thickness is decreased to several nanometers or less, and thus, the number of carriers in the silicon-based material decreases, thereby lowering electron mobility. In contrast, in the field effect transistor 100 according to the present embodiment, as each of the first and second channel layers 121 and 122 includes a 2D semiconductor material, high electron mobility may be maintained even when the thickness of each of the first and second channel layers 121 and 122 is decreased to several nanometers or less. Accordingly, the minimum channel length due to the short channel effect may be set to be short, and furthermore, excellent performance may be obtained.

According to the graph of FIG. 4, in which a silicon material is used for a channel, the minimum channel length has a value greater than 10 nm. However, as the field effect transistor 100 according to an embodiment uses a 2D semiconductor material for the first and second channel layers 121 and 122, a relatively shorter channel length may be implemented. For example, the channel thickness may be set to be 1 nm or less, and in this case, the channel length may be reduced to about 3 nm.

FIGS. 5A to 5E are schematic cross-sectional views of a manufacturing method of the field effect transistor of FIG. 1.

Figure 5A:
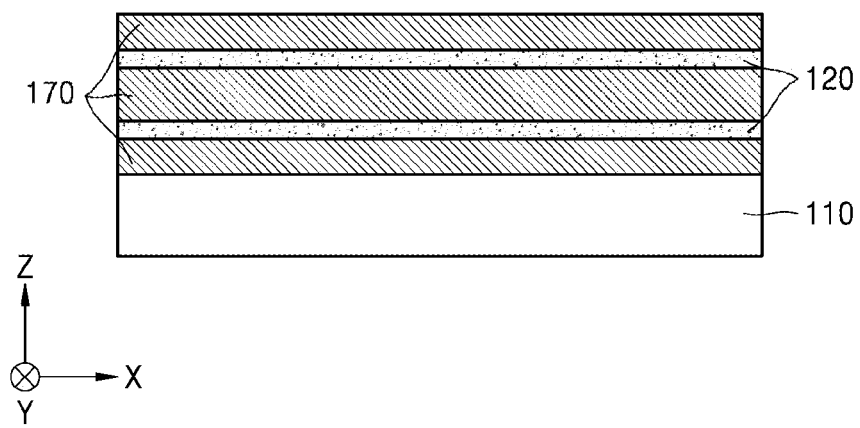
FIGS. 5A to 5E are schematic cross-sectional views of a manufacturing method of the field effect transistor of FIG. 1.

Referring to FIG. 5A, first, a support layer 170 and a channel material layer 120 are repeatedly stacked multiple times on the substrate 110. As illustrated in the drawing, the support layer 170 and the channel material layer 120 may be sequentially and alternately deposited multiple times.

The support layer 170, which supports the channel material layer 120, is a sacrificial layer that is removed after another structure for supporting the channel material layer 120 is formed. The support layer 170 supports the channel material layer 120, and furthermore, the support layer 170 may include a material having a different etch rate from the channel material layer 120 so as to be selectively removed. The support layer 170 may be formed by, for example, a chemical vapor deposition (CVD) method.

The channel material layer 120 may include a 2D semiconductor material by a method, for example, an organic metal chemical vapor deposition (MOCVD) method, an atomic layer deposition (ALD) method, etc. The channel material layer 120 may have a monolayer or multilayer structure including a 2D semiconductor material. The thickness of the channel material layer 120 may be 10 nm or less, 5 nm or less, or 1 nm or less. The thickness of the channel material layer 120 may be set considering the channel length to be formed.

The channel material layer 120 may include a 2D semiconductor material doped with a certain conductive dopant. The 2D semiconductor material of the channel material layer 120 may be doped with a p-type dopant or an n-type dopant. For example, a p-type dopant and an n-type dopant that are used for graphene, CNT, etc. may be used as the p-type dopant and the n-type dopant. The p-type dopant or the n-type dopant may be doped using an ion implantation method or a chemical doping method.

The source of the p-type dopant may include, for example, an ionic liquid of $NO_2BF_4$, $NOBF_4$, $NO_2SbF_6$, etc., an acidic compound of HCl, $H_2PO_4$, $CH_3COOH$, $H_2SO_4$, $HNO_3$, etc., or an organic compound of dichlorodicyanoquinone (DDQ), oxone, dimyristoylphosphatidylinositol (DMPI), trifluoromethanesulfoneimide, etc. Alternatively, a source of the p-type dopant may include $HPtCl_4$, $AuCl_3$, $HAuCl_4$, silver trifluoromethanesulfonate (AgOTf), $AgNO_3$, $H_2PdCl_6$, $Pd(OAc)_2$, $Cu(CN)_2$, etc.

A source of the n-type dopant may include, for example, a reduction product of a substituted or unsubstituted nicotinamide; a reduction product of a compound which is chemically bound to a substituted or unsubstituted nicotinamide; and a compound comprising at least two pyridinium moieties in which a nitrogen atom of at least one of the pyridinium moieties is reduced. For example, a source of the n-type dopant may include nicotinamide mononucleotide-H (NMNH), nicotinamide adenine dinucleotide-H (NADH), nicotinamide adenine dinucleotide phosphate-H (NADPH), or viologen. Alternatively, a source of the n-type dopant may include a polymer of polyethylenimine (PEI), etc. Alternatively, the n-type dopant may include alkali metal of K, Li, etc. The above-described p-type dopant material and n-type dopant material are an example, and various other materials may be used as a dopant.

As such, after forming a structure in which the support layer 170 and the channel material layer 120 are alternately stacked, the structure may be patterned by a photolithography process.

Figure 5B:
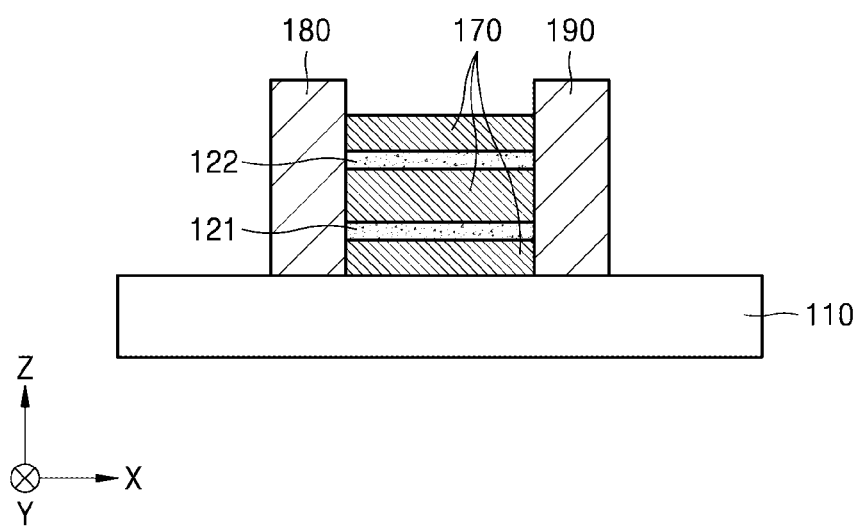

Referring to FIG. 5B, a structure including the support layer 170, the first channel layer 121, the support layer 170, the second channel layer 122, and the support layer 170 may be formed by patterning using a photolithography process. Furthermore, the source electrode 180 and the drain electrode 190 having a certain shape contacting the first channel layer 121 and the second channel layer 122 may be formed.

Figure 5C:
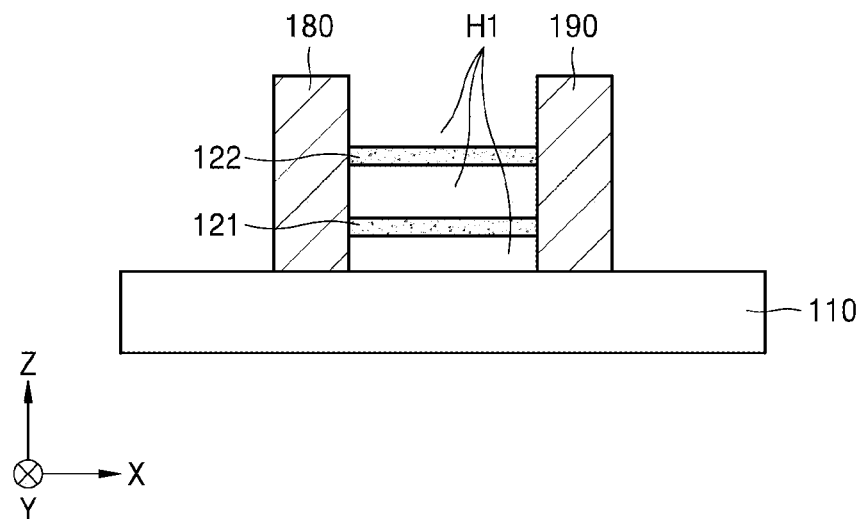

Next, the support layer 170 may be removed. To remove the support layer 170, an etching gas that selectively etches the support layer 170 only may be used. An etching process is performed until the channel layer 121 and the second channel layer 122 are exposed to a certain space H1, and as illustrated in FIG. 5C, a structure is formed, in which the first channel layer 121 and the second channel layer 122 are supported in the form of a bridge between the source electrode 180 and the drain electrode 190.

Figure 5D:
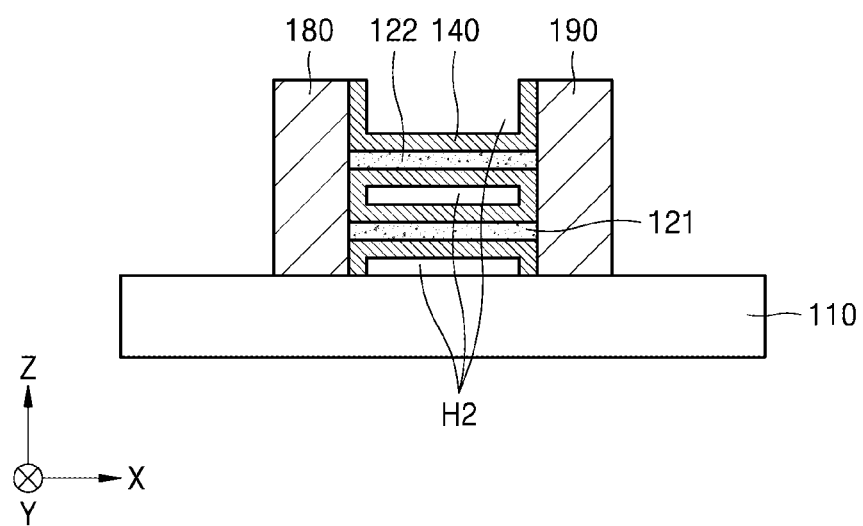

Next, as illustrated in FIG. 5D, the gate insulating film 140 surrounding each of the first channel layer 121 and the second channel layer 122 is formed. The gate insulating film 140 may be formed by depositing a certain insulating material on surfaces of the first channel layer 121 and the second channel layer 122, by using a method, for example, CVD, ALD, physical vapor deposition (PVD), etc. The gate insulating film 140 may surround each of the first channel layer 121 and the second channel layer 122, for example, as illustrated in FIG. 3 that is a cross-sectional view in a direction different from the direction of FIG. 5D.

Furthermore, the gate insulating film 140 may extend on the surfaces of the source electrode 180 and the drain electrode 190. The deposition process of the gate insulating film 140 may be performed such that a certain space H2 for forming a gate electrode is left.

Figure 5E:
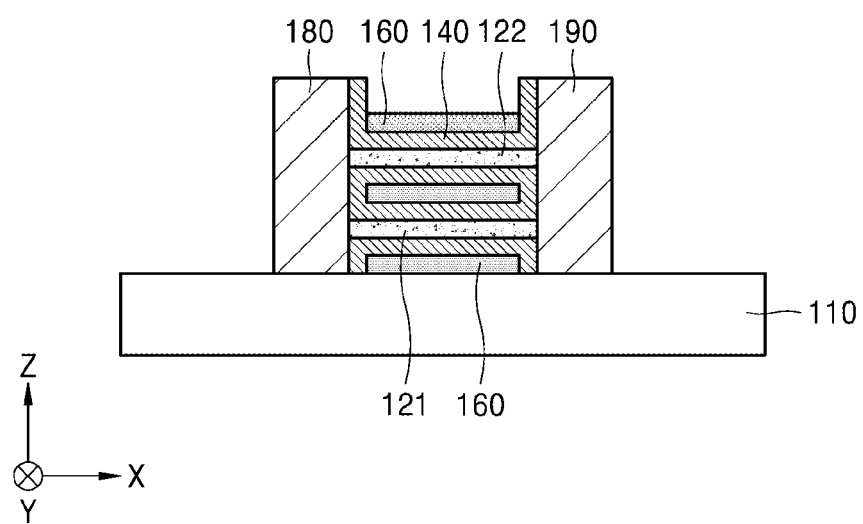

Next, as illustrated in FIG. 5E, the gate electrode 160 is formed by depositing an electrode material on the space H2. The gate electrode 160 may surround the gate insulating film 140, for example, as illustrated in FIG. 3 that is a cross-sectional view in a direction different from the direction of FIG. 5E.

The manufacturing method described with respect to FIGS. 5A to 5E is an example, and the disclosure is not limited thereto. Other methods for forming the transistor structure illustrated in FIGS. 1 to 3 may be used.

Figure 6:
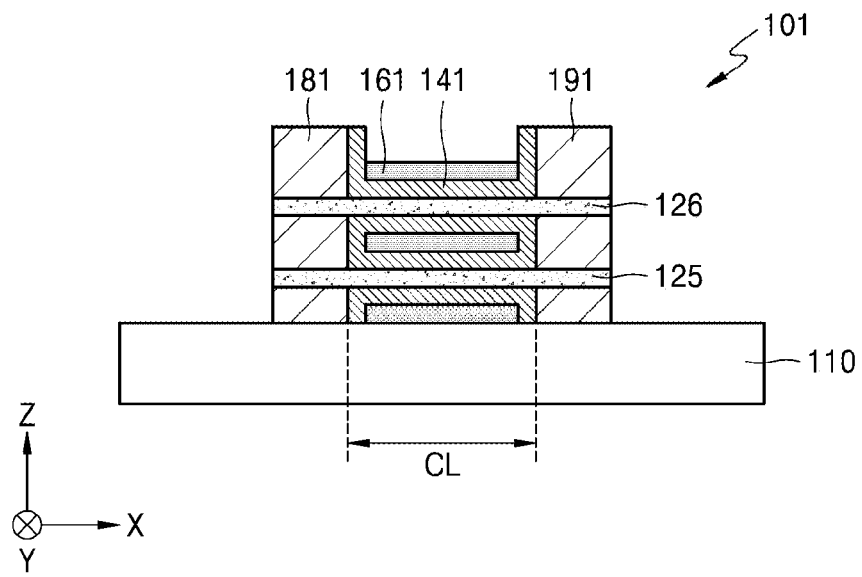
FIG. 6 is a schematic cross-sectional view of a structure of a field effect transistor according to another embodiment.
Figure 7:
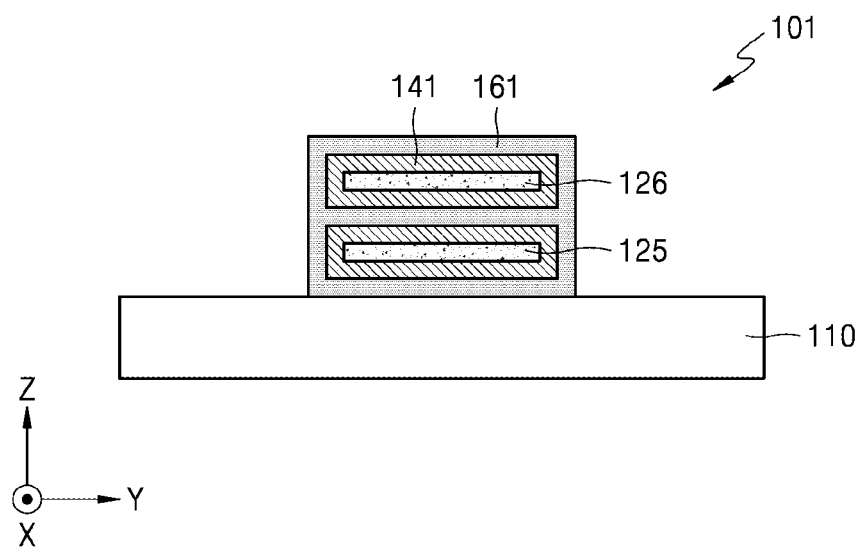
FIG. 7 is a cross-sectional view of the field effect transistor of FIG. 6, viewed from another section.

FIG. 6 is a schematic cross-sectional view of a structure of a field effect transistor 101 according to another embodiment. FIG. 7 is a cross-sectional view of the field effect transistor 101 of FIG. 6, viewed from another section.

The field effect transistor 101 may include a first channel layer 125 and a second channel layer 126, which are vertically stacked on the substrate 110 to be apart from each other, a source electrode 181 and a drain electrode 191 contacting the first channel layer 125 and the second channel layer 126, and a gate electrode 161 which is arranged apart from the first channel layer 125 and the second channel layer 126.

A gate insulating film 141 is formed to surround each of the first channel layer 125 and the second channel layer 126. The gate electrode 161 is provided surrounding the gate insulating film 141.

As illustrated in FIG. 7, the gate insulating film 141 may contact the first channel layer 125 and the second channel layer 126 and may have a shape surrounding each of the first channel layer 125 and the second channel layer 126 in a closed path with an axis in the first direction (X direction). The gate electrode 161 may be apart from each of the first channel layer 125 and the second channel layer 126 with the gate insulating film 141 therebetween and may have a shape surrounding each of a first channel layer 125, a second channel layer 126, in a closed path with an axis in the first direction (X direction).

The field effect transistor 101 according to the present embodiment is different from the field effect transistor 100 described with respect to FIGS. 1 to 3 in terms of the shape in which the first and second channel layers 125 and 126 contact the source electrode 181 and the drain electrode 191.

The first channel layer 125 may include two contact areas in planar contact with the source electrode 181 and the drain electrode 191, and the second channel layer 126 is in planar contact with the source electrode 181 and the drain electrode 191 in a similar manner.

The channel length CL is defined to be a length between the source electrode 181 and the drain electrode 191 of the areas of the first and second channel layers 125 and 126, as illustrated in the drawing. The channel length CL may be set to be the minimum defined by the thickness of each of the first and second channel layers 125 and 126, that is, the thickness in the stacking direction (Z direction). The thickness of each of the first and second channel layers 125 and 126 may be 10 nm or less, or 5 nm or less, or 1 nm or less. When the thickness of each of the first and second channel layers 125 and 126 is 1 nm or less, the channel length CL may be 3 nm or less.

Figure 8:
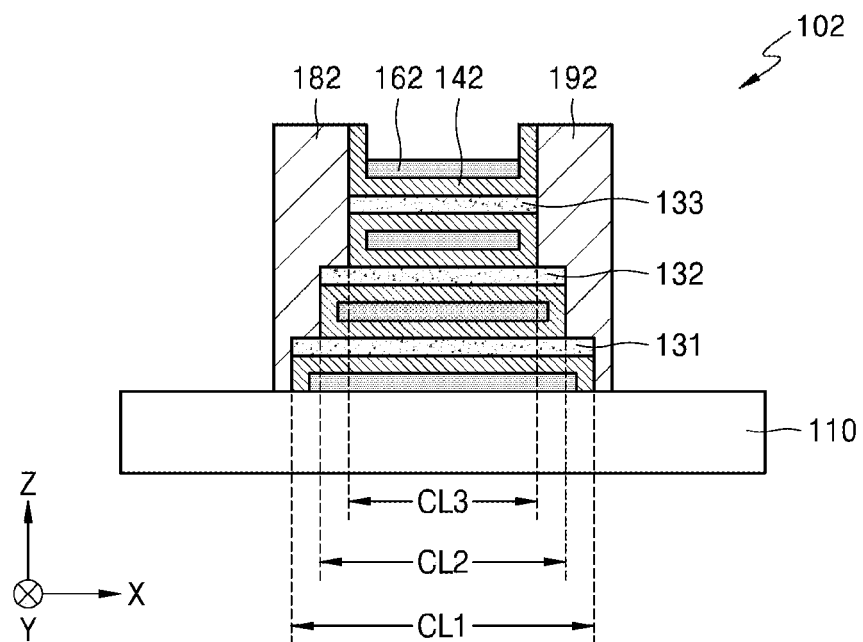
FIG. 8 is a schematic cross-sectional view of a structure of a field effect transistor according to another embodiment.
Figure 9:
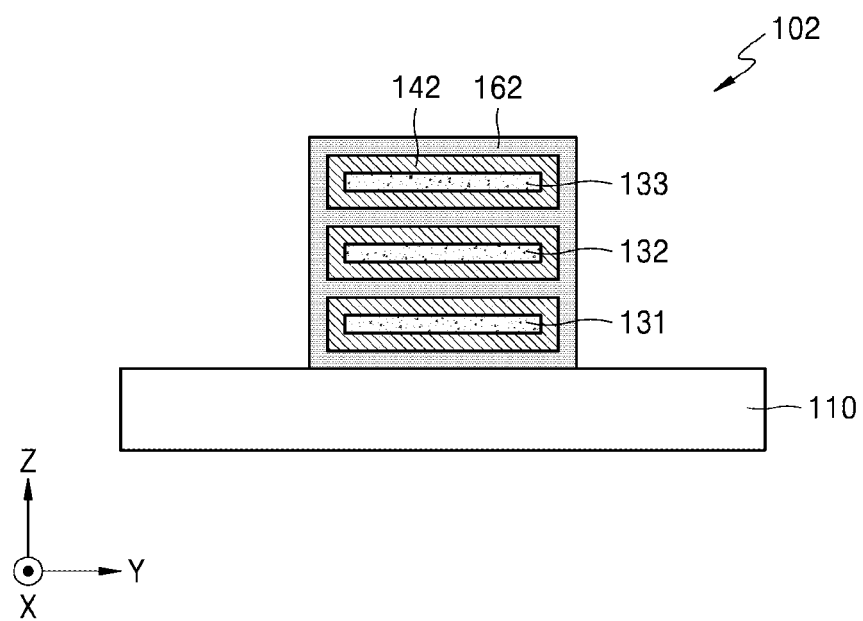
FIG. 9 is a cross-sectional view of the field effect transistor of FIG. 8, viewed from another section.

FIG. 8 is a schematic cross-sectional view of a structure of a field effect transistor 102 according to another embodiment. FIG. 9 is a cross-sectional view of the field effect transistor 102 of FIG. 8, viewed from another section.

The field effect transistor 102 may include a first channel layer 131, a second channel layer 132, and a third channel layer 133, which are vertically stacked on the substrate 110 to be apart from each other, a source electrode 182 and a drain electrode 192 contacting the first channel layer 131, the second channel layer 132, and the third channel layer 133, and a gate electrode 162 arranged apart from the first channel layer 131, the second channel layer 132, and the third channel layer 133.

A gate insulating film 142 may be provided to surround each of the first channel layer 131, the second channel layer 132, and the third channel layer 133. The gate electrode 162 may be provided to surround the gate insulating film 142.

As illustrated in FIG. 9, the gate insulating film 142 may contact the first channel layer 131, the second channel layer 132, and the third channel layer 133 and may have a shape surrounding each of the first channel layer 131, the second channel layer 132, and the third channel layer 133 in a closed path with an axis in the first direction (X direction). The gate electrode 162 may be apart from each of the first channel layer 131, the second channel layer 132, and the third channel layer 133 with the gate insulating film 142 therebetween and may have a shape surrounding each of the first channel layer 131, the second channel layer 132, and the third channel layer 133 in a closed path with an axis in the first direction (X direction).

In the present embodiment, each of the first channel layer 131, the second channel layer 132, and the third channel layer 133 may have channel lengths CL1, CL2, and CL3 different from one another. The first channel layer 131, the second channel layer 132, and the third channel layer 133 may be arranged on the substrate 110 in order of the channel length decreasing.

As described above, the channel length may be set to be a minimum length that may be implemented according to the thickness of a channel layer, and accordingly, the first channel layer 131, the second channel layer 132, and the third channel layer 133 may have thicknesses different from one another. For example, the first channel layer 131 having the channel length CL1 that is the longest may be the thickest, and then the thicknesses of the channel layers may be set in order of the second channel layer 132 and the third channel layer 133. The thickness of the third channel layer 133 having the channel length CL3 that is the shortest may be, for example, 1 nm or less, and the thickness of the channel length CL3 may be 3 nm or less. However, this is an example, and the thicknesses of the first channel layer 131, the second channel layer 132, and the third channel layer 133 may be identical to one another.

Although FIGS. 8 and 9 illustrate three channel layers, the disclosure is not limited thereto, and the field effect transistor 102 may have a shape of a plurality of channel layers having two or more different channel lengths.

Figure 10:
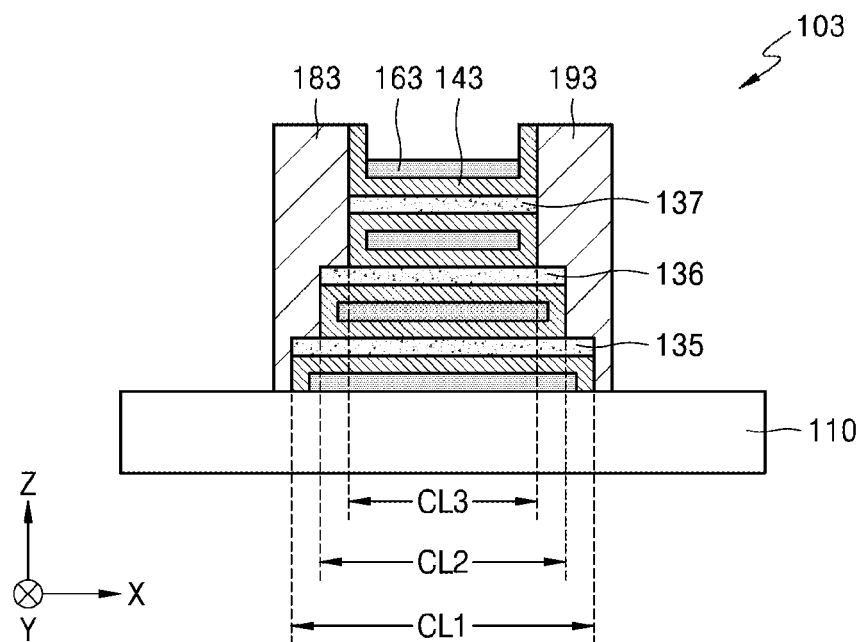
FIG. 10 is a schematic cross-sectional view of a structure of a field effect transistor according to another embodiment.
Figure 11:
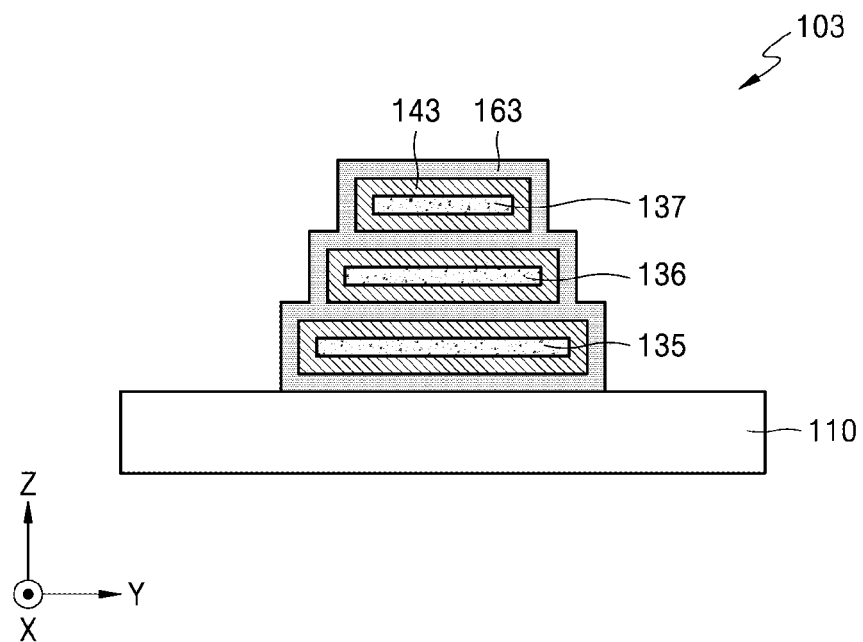
FIG. 11 is a cross-sectional view of the field effect transistor of FIG. 10, viewed from another section.

FIG. 10 is a schematic cross-sectional view of a structure of a field effect transistor 103 according to another embodiment. FIG. 11 is a cross-sectional view of the field effect transistor 103 of FIG. 10, viewed from another section.

The field effect transistor 103 may include a first channel layer 135, a second channel layer 136, and a third channel layer 137, which are vertically stacked on the substrate 110 to be apart from one another, a source electrode 183 and a drain electrode 193 contacting the first channel layer 135, the second channel layer 136, and the third channel layer 137, and a gate electrode 163 disposed apart from the first channel layer 135, the second channel layer 136, and the third channel layer 137.

A gate insulating film 143 may be provided to surround each of the first channel layer 135, the second channel layer 136, and the third channel layer 137. The gate electrode 163 may be provided to surround the gate insulating film 143.

The field effect transistor 103 according to the present embodiment is similar to the field effect transistor 102 described with respect to FIGS. 8 and 9 in that the first channel layer 135, the second channel layer 136, and the third channel layer 137 respectively have the channel lengths CL1, CL2, and CL3, but is different from the field effect transistor 102 in that, as illustrated in FIG. 11, the widths in the third direction (Y direction) that is perpendicular to the channel length direction are different from each other.

The first channel layer 135, the second channel layer 136, and the third channel layer 137 may be arranged on the substrate 110 in order of the width decreasing. Although FIG. 11 illustrates that the widths in the third direction of each of the first channel layer 135, the second channel layer 136, and the third channel layer 137 are illustrated to be different from one another, this is an example, and two or more channels layers may have widths that are different from each other.

Figure 12A:
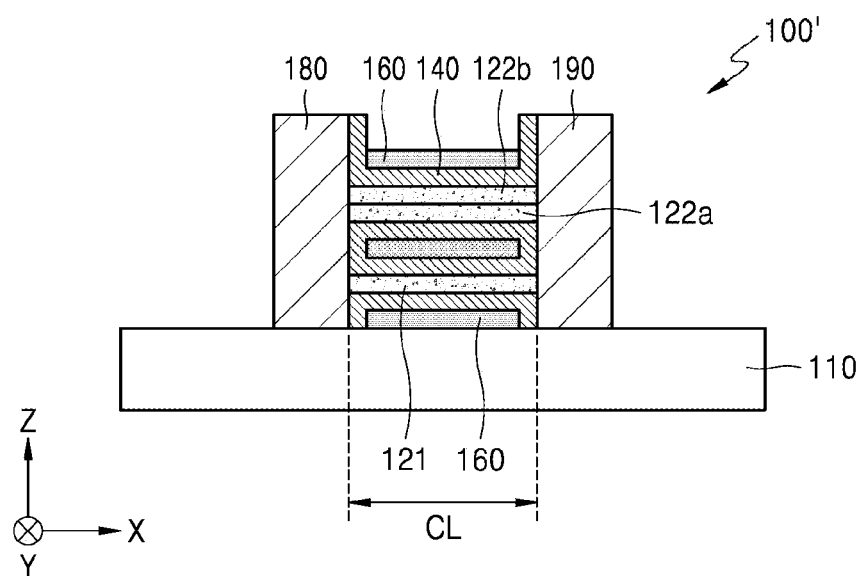
FIGS. 12A and 12B are cross-sectional views illustrating a modification of the transistor of FIGS. 1-3.
Figure 12B:
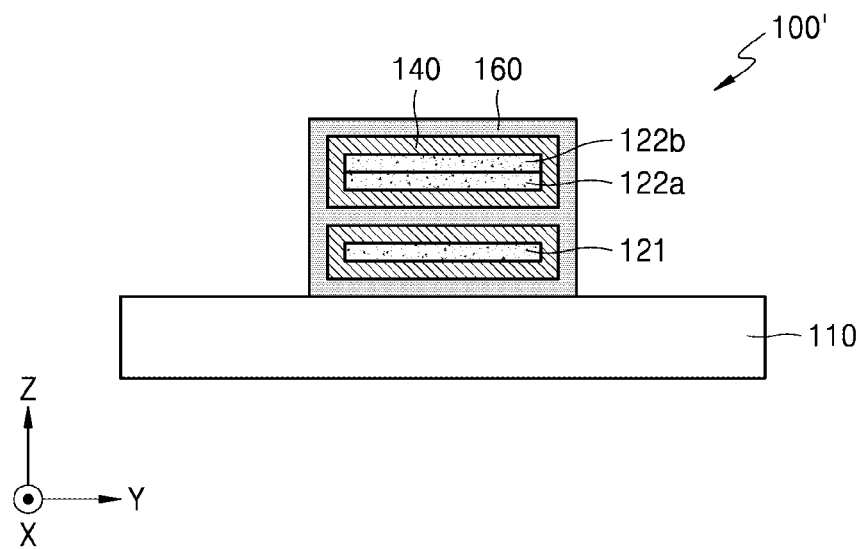

FIGS. 12A and 12B are cross-sectional views illustrating a modification of the transistor of FIGS. 1-3.

Referring to FIGS. 12A and 12B, the transistor 100' in FIGS. 12A and 12B is similar to the transistor 100 in FIGS. 1-3, except there are two channel layers 122a and 122b in the transistor 100' instead of the channel layer 122 in the transistor 100. The two channel layers 122a and 122b may be the same two-dimensional material to provide a thicker channel layer. Alternatively, the two channel layers 122a and 122b may include different two-dimensional materials. One or both of the two channel layers 122a and 122b may include a dopant.

Figure 13A:
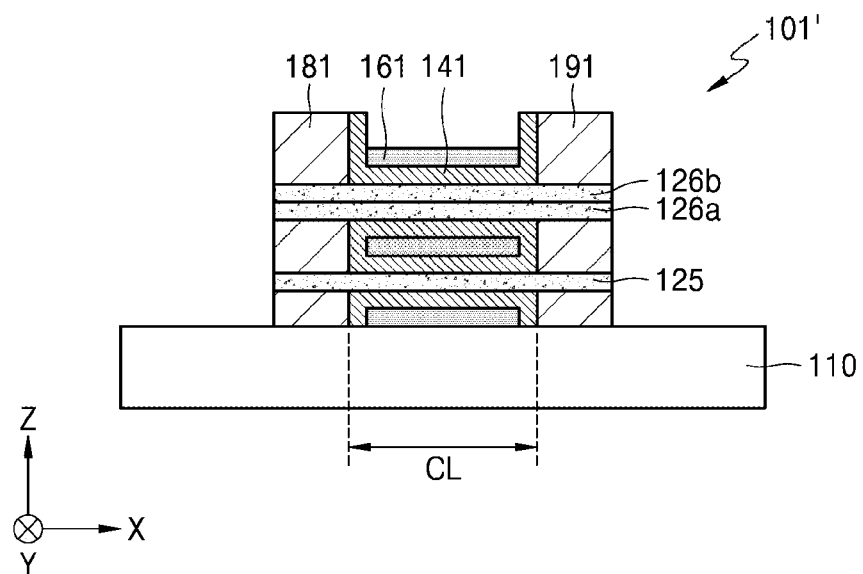
FIGS. 13A and 13B are cross-sectional views illustrating a modification of the transistor of FIGS. 6-7.
Figure 13B:
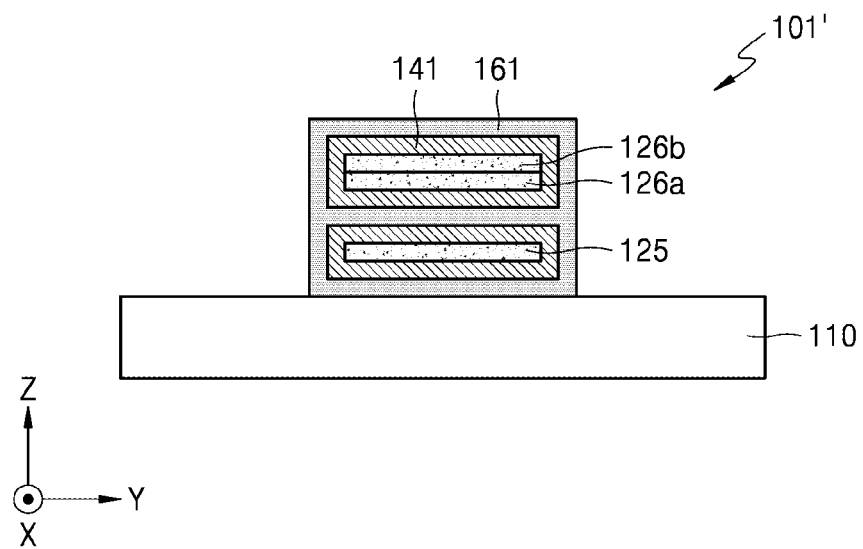

FIGS. 13A and 13B are cross-sectional views illustrating a modification of the transistor of FIGS. 6-7.

The transistor 101' in FIGS. 13A and 13B is similar to the transistor 101 in FIGS. 6-7, except there are two channel layers 126a and 126b in the transistor 101' instead of the single channel layer 126 in the transistor 101. The two channel layers 126a and 126b may be the same two-dimensional material to provide a thicker channel layer. Alternatively, the two channel layers 126a and 126b may include different two-dimensional materials form each other. One or both of the two channel layers 126a and 126b may include a dopant.

Figure 14A:
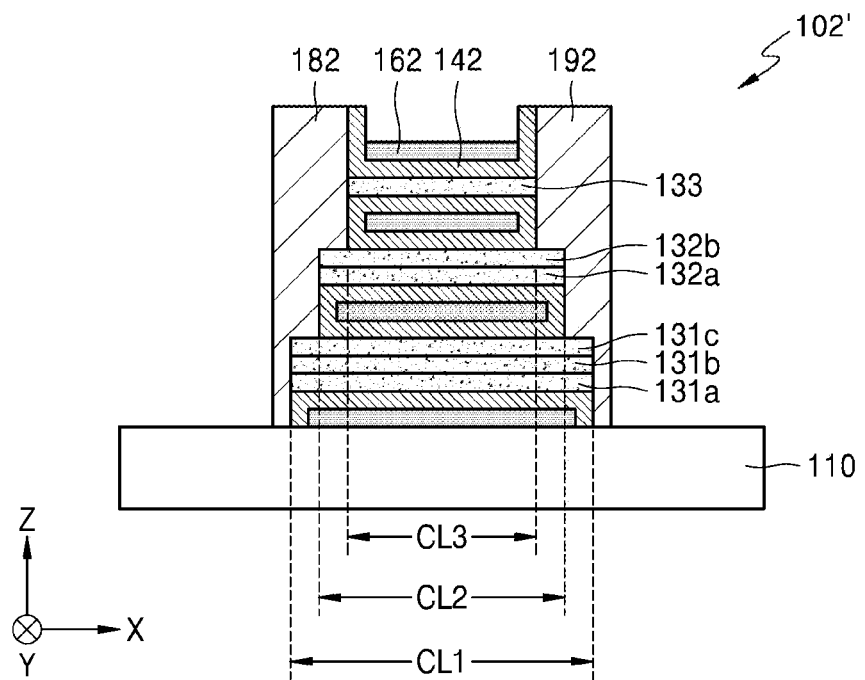
FIGS. 14A and 14B are cross-sectional views illustrating a modification of the transistor of FIGS. 8-9.
Figure 14B:
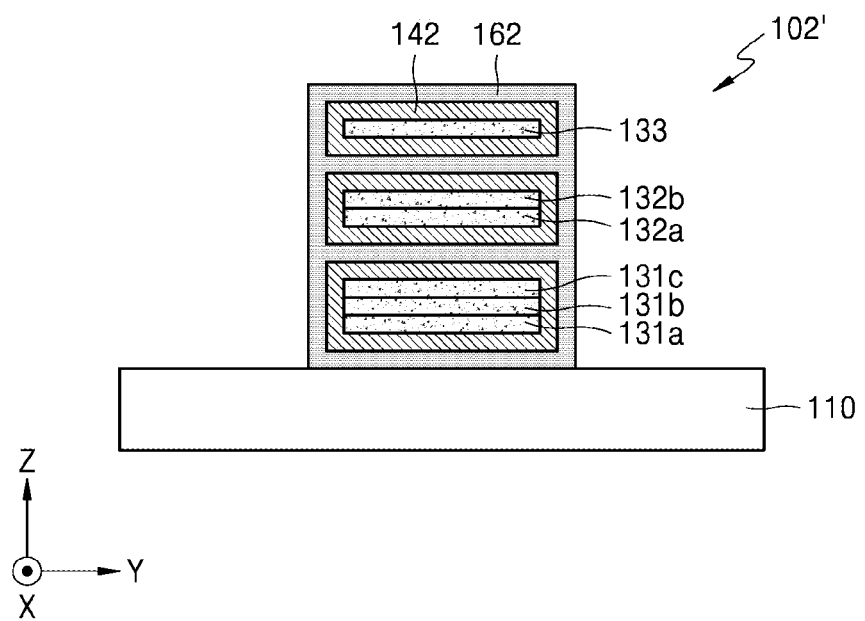

FIGS. 14A and 14B are cross-sectional views illustrating a modification of the transistor of FIGS. 8-9.

Referring FIGS. 14A and 14B, the transistor 102' in FIGS. 14A and 14B is similar to the transistor 102 in FIGS. 8-9, except there are two channel layers 132a and 132b in the transistor 102' instead of the channel layer 132 in the transistor 102. The two channel layers 132a and 132b may be the same two-dimensional material to provide a thicker channel layer. Alternatively, the two channel layers 132a and 132b may include different two-dimensional materials from each other. One or both of the two channel layers 132a and 132b may include a dopant.

Additionally, the transistor 102' in FIGS. 14A and 14B may include three channel layers 131a, 131b, and 131c instead of the channel layer 131 in the transistor 102. The three channel layers 131a, 131b, and 131c may be the same two-dimensional material to provide a thicker channel layer. Alternatively, two or three of the channel layers 131a, 131b, and 131c may include different two-dimensional materials from each other. At least one of the channel layers 131a, 131b, and 131c may include a dopant.

Although not illustrated, the transistor 102' in FIGS. 14A and 14B may be modified further by making the widths of the channel layers different in the Y-direction. For example, similar to the transistor 103 in FIGS. 10-11, the transistor 102' in FIGS. 14A and 14B may be modified so the widths of the channel layers 132a and 132b in the Y-direction are greater than the width of the channel layer 133 in the Y-direction and less than the width of the channel layers 131a to 131c in the Y-direction.

Figure 14C:
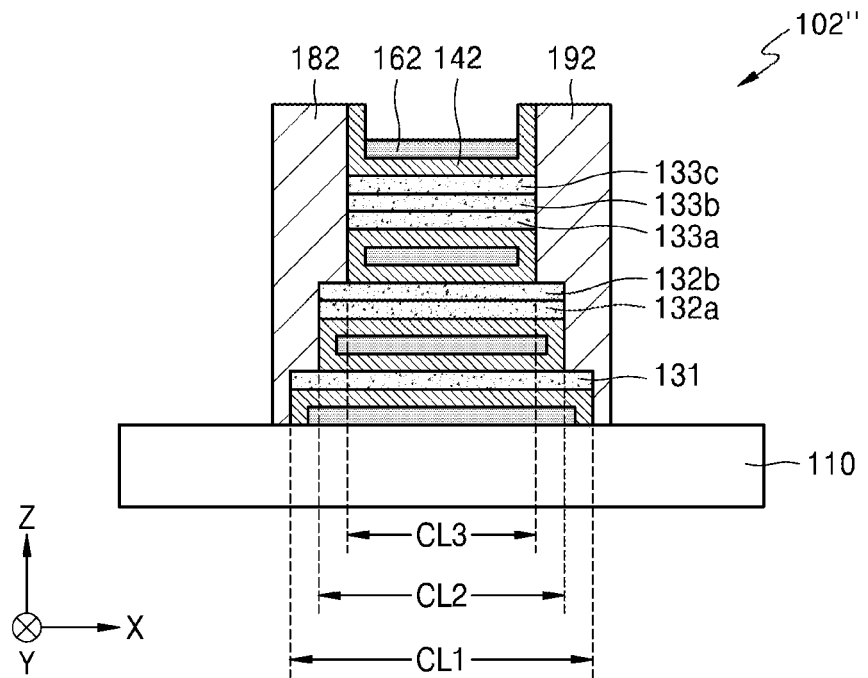
FIGS. 14C and 14D are cross-sectional views illustrating a modification of the transistor of FIGS. 8-9.
Figure 14D:
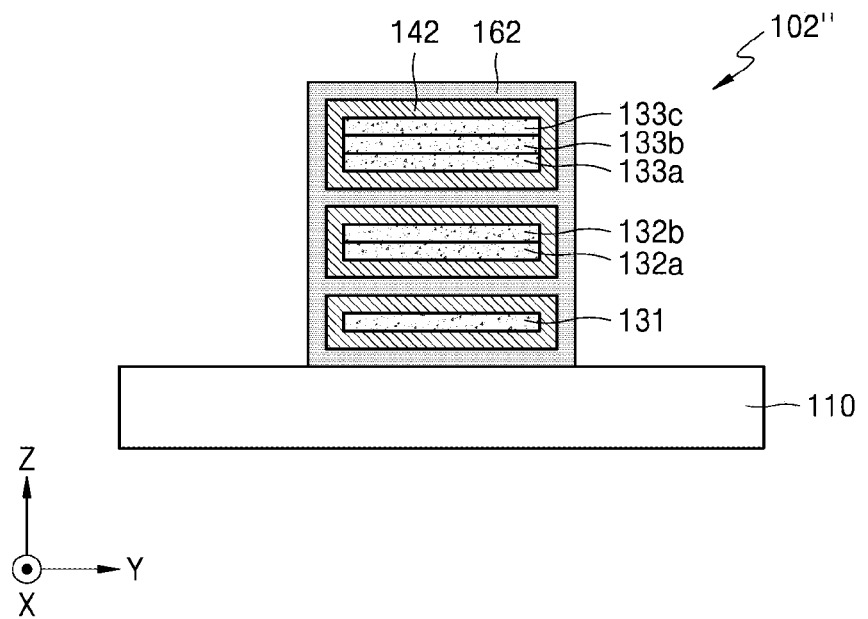

FIGS. 14C and 14D are cross-sectional views illustrating a modification of the transistor of FIGS. 8-9.

Referring FIGS. 14C and 14D, the transistor 102" in FIGS. 14C and 14D is similar to the transistor 102 in FIGS. 8-9, except there are two channel layers 132a and 132b in the transistor 102' instead of the channel layer 132 in the transistor 102. The two channel layers 132a and 132b may be the same two-dimensional material to provide a thicker channel layer. Alternatively, the two channel layers 132a and 132b may include different two-dimensional materials from each other. One or both of the two channel layers 132a and 132b may include a dopant.

Additionally, the transistor 102" in FIGS. 14C and 14D may include three channel layers 133a, 133b, and 133c instead of the channel layer 133 in the transistor 102. The three channel layers 133a, 133b, and 133c may be the same two-dimensional material to provide a thicker channel layer. Alternatively, two or three of the channel layers 133a, 133b, and 133c may include different two-dimensional materials from each other. At least one of the channel layers 133a, 133b, and 133c may include a dopant.

Although not illustrated, the transistor 102" in FIGS. 14C and 14D may be modified further by making the widths of the channel layers different in the Y-direction. For example, similar to the transistor 103 in FIGS. 10-11, the transistor 102" in FIGS. 14A and 14B may be modified so the widths of the channel layers 132a and 132b in the Y-direction are greater than the width of the channel layer 131 in the Y-direction and less than the width of the channel layers 133a to 133c in the Y-direction.

As the field effect transistors 100, 100', 101, 101', 102, 102', 102" and 103 described above exhibit excellent electrical performance with an ultra-compact structure, the field effect transistors 100, 100', 101, 101', 102, 102', 102", and 103 may be applied to integrated circuit devices and may implement miniaturization, low power, and high performance.

The above-described field effect transistor may include a multi-bridge shaped channel and employ a 2D material as a channel material, thereby effectively reducing the channel length.

As the above-described field effect transistors have an ultra-compact size and excellent electrical performance, the above-described field effect transistors may be suitable for integrated circuit devices having a high degree of integration.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A field effect transistor comprising:
a substrate;
a source electrode and a drain electrode on the substrate and apart from each other in a first direction;
a plurality of channel layers on the substrate, each of the plurality of channel layers having both ends contacting the source electrode and the drain electrode, the plurality of channel layers being apart from each other in a second direction away from the substrate, and the plurality of channel layers comprising a 2D semiconductor material;
a gate insulating film surrounding each of the plurality of channel layers; and
a gate electrode surrounding the gate insulating film,
wherein the 2D semiconductor material comprises a transition metal dichalcogenide,
a thickness in the second direction of at least one of the plurality of channel layers is greater than 0 nm and less than or equal to about 1 nm, and
a length in the first direction of at least one of the plurality of channel layers is greater than 0 nm and less than or equal to about 3 nm.

2. The field effect transistor of claim 1, wherein each of the plurality of channel layers comprises two edges extending in a third direction perpendicular to the first direction and the second direction, the two edges respectively contacting the source electrode and the drain electrode.

3. The field effect transistor of claim 1, wherein each of the plurality of channel layers comprises two contact areas in planar contact with the source electrode and the drain electrode.

4. The field effect transistor of claim 1, wherein the plurality of channel layers comprise a first channel layer and a second channel layer having different lengths in the first direction.

5. The field effect transistor of claim 4, wherein the first channel layer and the second channel layer are arranged on the substrate in order of length in the first direction decreasing.

6. The field effect transistor of claim 4, wherein the first channel layer and the second channel layer have different thicknesses from each other.

7. The field effect transistor of claim 4, wherein the first channel layer and the second channel layer have different lengths in a third direction perpendicular to each of the first direction and the second direction.

8. The field effect transistor of claim 7, wherein the first channel layer and the second channel layer are arranged on the substrate in order of length in the third direction decreasing.

9. The field effect transistor of claim 1, wherein the gate insulating film contacts the plurality of channel layers and has a shape surrounding each of the plurality of channel layers in a closed path with an axis in the first direction.

10. The field effect transistor of claim 9, wherein the gate electrode is apart from the plurality of channel layers and has a shape surrounding each of the plurality of channel layers in a closed path with an axis in the first direction.

11. The field effect transistor of claim 9, wherein the gate insulating film has a shape of extending to an area between the gate electrode and the source electrode and an area between the gate electrode and the drain electrode.

12. The field effect transistor of claim 1, wherein
the transition metal dichalcogenide comprises a metal element and a chalcogen element,
the metal element includes Mo, W, Nb, V, Ta, Ti, Zr, Hf, Tc, Re, Cu, Ga, In, Sn, Ge, Pb, or a combination thereof, and
the chalcogen element includes S, Se, Te, or a combination thereof.

13. The field effect transistor of claim 1, wherein the 2D semiconductor material is doped with a conductive dopant.

14. The field effect transistor of claim 1, wherein the plurality of channel layers comprise a same 2D semiconductor material.

15. The field effect transistor of claim 1, wherein the gate insulating film comprises a high-k dielectric material or a ferroelectric material.

16. The field effect transistor of claim 1, wherein
a length of the channel layer in the first direction is set to a minimum length determined by a thickness of the channel layer in the second direction.

17. The field effect transistor of claim 1, wherein a thickness of at least one of the plurality of channel layers in the second direction is greater than 0 nm and less than or equal to about 5 nm.

* * * * *